US005905417A

United States Patent [19]

[11] Patent Number: 5,905,417

[45] Date of Patent: May 18, 1999

Norte et al.

[54] PASSIVE CASCADED LOW-PASS AND HIGH-PASS FILTER WITH VARIABLE ATTENUATION

[75] Inventors: David A. Norte; Woong K. Yoon, both of Westminster, Colo.

[73] Assignee: Lucent Technologies Inc., Murray Hill, N.J.

[21] Appl. No.: 08/815,617

[22] Filed: Mar. 12, 1997

[51] Int. Cl.$^{6}$ .............................. H03H 7/01; H01P 1/215

[52] U.S. Cl. .............................................. 333/185; 333/12

[58] Field of Search .................................... 333/167, 174, 333/176, 181, 185, 12, 81 R

[56] References Cited

U.S. PATENT DOCUMENTS

| | | | |
|---|---|---|---|
| 2,948,868 | 8/1960 | Reeves | 333/81 B |
| 3,356,967 | 12/1967 | Honig | 333/17.1 |
| 4,146,854 | 3/1979 | Ishino et al. | 333/181 X |
| 4,510,468 | 4/1985 | Mayer | 333/12 |
| 4,622,527 | 11/1986 | Carlson | 333/185 X |
| 4,698,605 | 10/1987 | Imamura et al. | 333/184 |
| 4,719,433 | 1/1988 | Hackel et al. | 333/181 X |
| 4,758,808 | 7/1988 | Sasaki et al. | 333/185 |
| 4,796,079 | 1/1989 | Hettiger | 333/12 X |
| 5,101,182 | 3/1992 | Babbitt et al. | 333/205 |

*Primary Examiner*—Seungsook Ham
*Attorney, Agent, or Firm*—David Volejnicek

[57] ABSTRACT

A passive cascaded low-pass and high-pass filter comprises a conductive ferrite block (100) for filtering out some and not others of the frequencies of a multi-frequency electrical signal, and a pair of electrical contacts (101) on the block for connecting the unfiltered signal to the block and connecting the filtered signal from the block. The filter characteristic depends upon the ferrite's stoichiometry, but is independent of the ferrite's geometry. Signal attenuation caused by the filter evenly across the whole frequency range can be varied by varying the stress between one or both contacts and the block, via various stress-inducing mechanisms (400, 500).

20 Claims, 2 Drawing Sheets

PASSIVE CASCADED LOW-PASS AND HIGH-PASS FILTER WITH VARIABLE ATTENUATION

TECHNICAL FIELD

This invention relates to filters for electrical signals.

BACKGROUND OF THE INVENTION

The ability to simultaneously transmit both low-frequency and high-frequency signals with significant attenuation between the low-frequency and high-frequency regions is often desired in communications—for example, in frequency-division multiplex systems and in subcarrier multiplex systems. Such an effect can be achieved either through a notch filter, or through a cascade of a low-pass filter and a high-pass filter. Known such filters are active electronic components—that is, they require an external source of power—that tend to be rather complex in structure and expensive, and that tend to take up a significant surface area of a printed-circuit board.

SUMMARY OF THE INVENTION

A technical advance over the prior art is achieved by the use of a conductive ferrite as a cascaded low-pass and high-pass filter. The ferrite filter is a passive component that requires no source of power for its operation other than the electrical signal which it is filtering. The ferrite filter illustratively comprises only a conductive ferrite body for filtering out some and not others of the frequencies of a multi-frequency electrical signal, a first electrical contact on the body for conveying the unfiltered signal to the body, and a second electrical contact on the body for conveying the filtered signal from the body. Compared to active filters, the ferrite filter is simple in structure, inexpensive, and—because its operational characteristics are independent of its geometry—small. It can be dimensioned in any desired way, and therefore is suited for use with surface-mount circuit-assembly techniques, and even for incorporation into integrated circuits (ICs). Advantageously, the ferrite filter is also easily adapted to variably evenly attenuate the entire frequency range of the filtered signal. This is illustratively accomplished merely by attaching a stress-inducing mechanism to the filter that varies the stress between one or both of the contacts and the ferrite body and thereby varies the signal attenuation produced by the filter.

These and other advantages and features of the invention will become more apparent from the following description of an illustrative embodiment of the invention taken together with the drawing.

DETAILED DESCRIPTION

Figure 1:
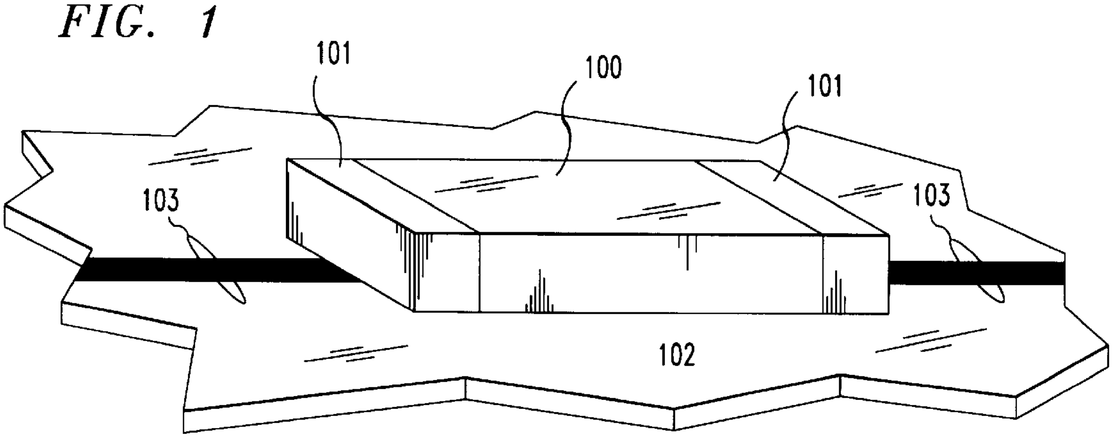
FIG. 1 is a perspective view of a first illustrative implementation of a cascaded low-pass and high-pass filter constructed according to the invention.

FIG. 1 shows a first implementation of a cascaded low-pass and high-pass filter constructed according to the invention. The filter comprises a conductive ferrite body, such as manganese zinc (MnZn), with a pair of separate ohmic contacts 101 on the body. The body illustratively takes the form of a block 100 of conductive ferrite material. Ohmic contacts 101 enable electrical circuit connections 103 to be made to block 100 for conveying the unfiltered and filtered multi-frequency signal to and from block 100, and also enable block 100 to be physically surface-mounted on a printed-circuit board 102. The geometry (e.g., the physical dimensions and shape) of block 100 and the position of contacts 101 do not affect the performance of block 100 as a filter. For example, FIG. 2 shows a second implementation of the cascaded low-pass and high-pass filter constructed according to the invention, which has the same performance as the filter of FIG. 1.

Figure 2:
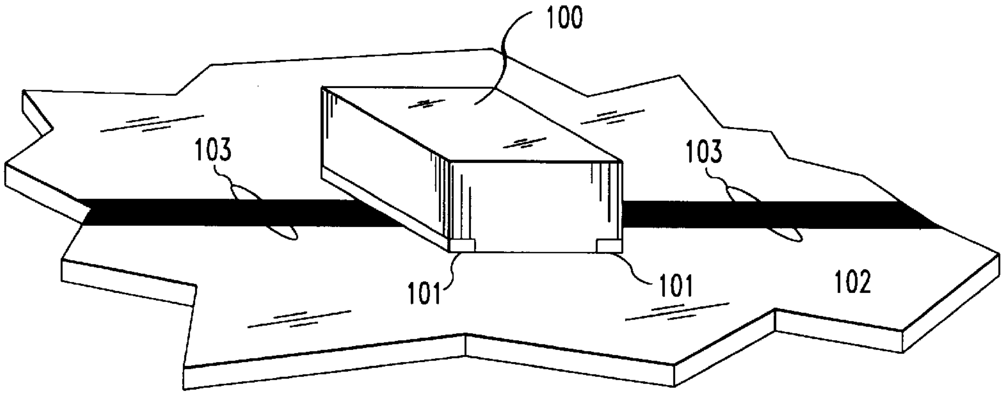
FIG. 2 is a perspective view of a second illustrative implementation of a cascaded low-pass and high-pass filter constructed according to the invention.
Figure 3:
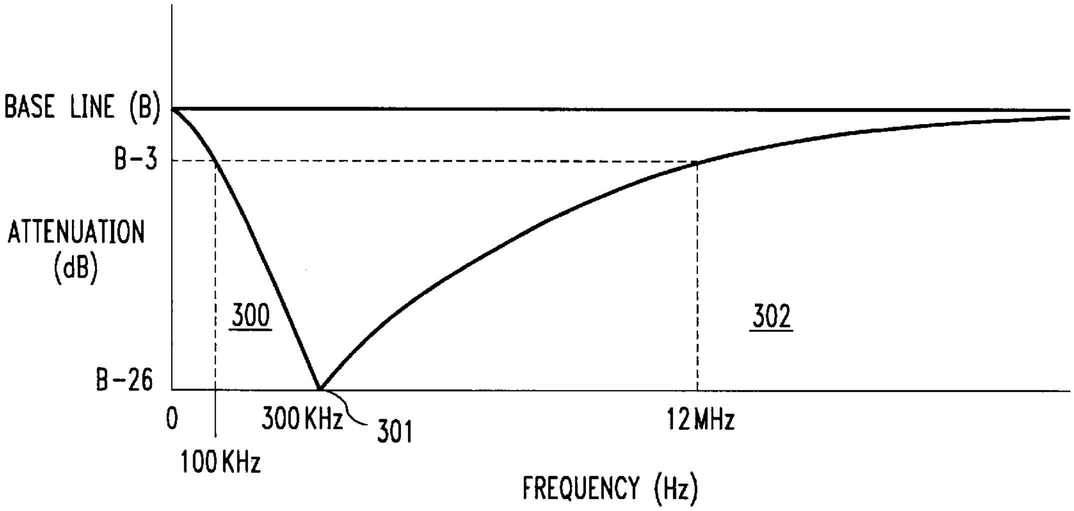
FIG. 3 is a frequency response diagram of the operational characteristics of the filters of FIGS. 1 and 2.

FIG. 3 shows the frequency response characteristic of the ferrite filters of FIGS. 1 and 2 for the MnZn material 3F4 of Phillips Components of The Netherlands. FIG. 3 shows that the filters simultaneously transmit both low-frequency signals 300 and high-frequency signals 302 with a significant notch 301 of attenuation—about 26 decibels (dB) deep—between the low-frequency and high-frequency regions. Notch 301 occurs at about 100 KHz. The low-frequency region 300 has a sharp roll-off characteristic and defines a low-pass filter having a 3-dB bandwidth of about 100 KHz. The high-frequency region 302 has a gentle roll-off characteristic and defines a high frequency filter having a 3-dB bandwidth of about 12 MHz. These bandwidths can be tuned to some degree by using ferrite materials having different stoichiometries (i.e., different types of conductive ferrite materials). For example, for the MnZn material 3F3 of Phillips Components, the low-pass region is below 40 KHz and the high-pass region is between about 25 MHz and about 1 GHz.

We theorize that the ferrite filter works as follows: An incoming multifrequency electrical signal induces an electric field in block 100 between contacts 101. Electrons in block 100 are freed of their bonds and enabled to move by the electric field, whereby they contribute to conduction through block 100 at the low and high frequencies. Notch 301 occurs at a resonance frequency of the ferrite material, where the electrons in block 100 oscillate but are not freed to move and to contribute to conduction. This theory suggests that, in order to function as a filter, the ferrite material must have a low volume resistivity—perhaps on the order of 0.1 Ω-cm or less.

Because the geometry of the ferrite filters has no effect on their performance, they can be made very small and can be dimensioned optimally for automated vacuum pickup and circuit assembly. The filters can even be made small enough for incorporation into integrated circuits (ICs).

Figure 4:
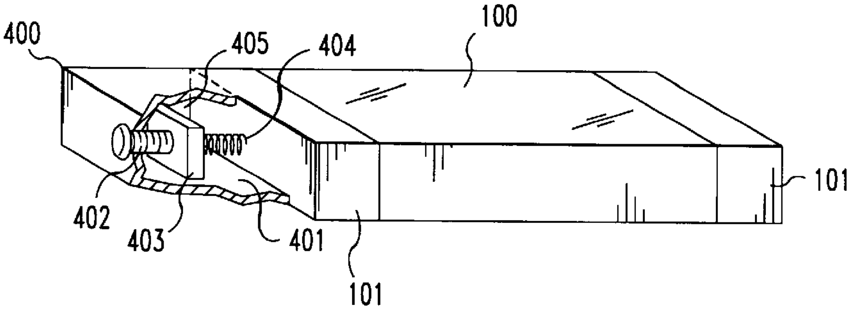
FIG. 4 is a cut-away perspective view of a first illustrative implementation of a variable-attenuation cascaded low-pass and high-pass filter constructed according to the invention.

It is often desirable to equally and simultaneously vary the attenuation of the different frequencies of a signal being output by a filter. In the case of the ferrite filters described above, this functionality is achieved by varying the quality of the ohmic contacts to the ferrite. One way of achieving this is shown in FIG. 4. FIG. 4 slows a first implementation of a variable-attenuation cascaded low-pass and high-pass filter constructed according to the invention. The filter of FIG. 4 has the same basic construction as the filter of FIG.

1. In addition, however, it includes a stress-inducing mechanism 400 which applies stress between ohmic contacts 101 and ferrite block 100. The amount of signal attenuation produced by the ferrite filter is varied by varying the amount of stress applied by mechanism 400.

The illustrative stress-inducing mechanism 400 of FIG. 4 comprises a hollow body 401 affixed at one end of block 100 to one of the contacts 101 and forming therewith a chamber 405. This contact 101 is not mounted to PC board 102, while the other contact 101 and body 401 are fixedly mounted (e.g., soldered) to PC board 102. Movably positioned inside of chamber 405 is a plate 403 that is attached to a screw 402. Turning of screw 402 moves plate 403 toward or away from contact 101. Extending between plate 403 and contact 101 is a spring 404. As screw 402 is turned in one direction, it moves plate 403 toward contact 101, and spring 404 is compressed between plate 403 and contact 101, thereby producing increased stress between contacts 101 and block 100. Turning screw 402 in the other direction decompresses spring 404 and reduces stress between contacts 101 and block 100.

Figure 5:
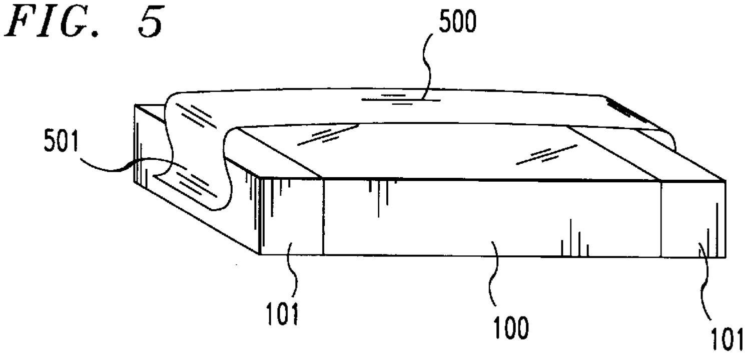
FIG. 5 is a perspective view of a second illustrative implementation of a variable-attenuation cascaded low-pass and high-pass filter constructed according to the invention.

FIG. 5 shows a second implementation of a variable-attenuation cascaded low-pass and high-pass filter constructed according to the invention. This implementation substitutes a non-conductive clamp or clip 500 for the stress-inducing mechanism 400 of FIG. 4. Jaws 501 of clamp or clip 500 apply pressure to both contacts 101 and thereby produce stress between contacts 101 and block 100. To increase or decrease the stress, either an adjustable clamp or a stronger or a weaker clip is used.

Figure 6:
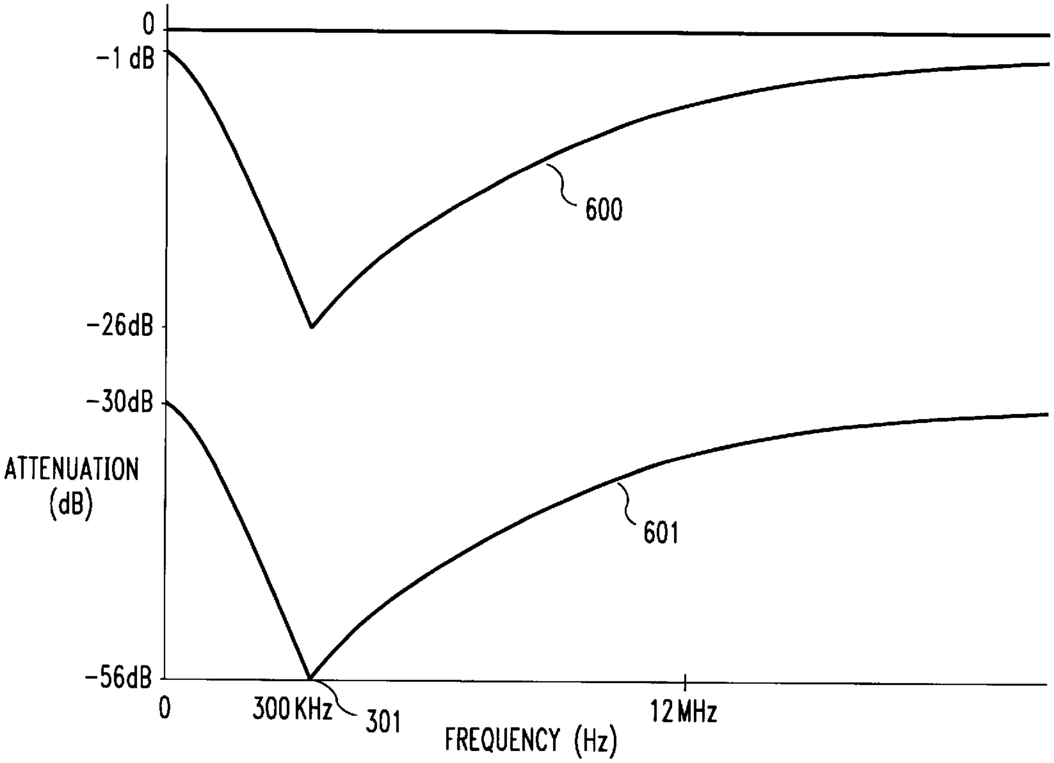
FIG. 6 is a frequency response diagram of the operational characteristics of the filters of FIGS. 4 and 5.

FIG. 6 shows the frequency response characteristic of the ferrite filters of FIGS. 4 and 5. At maximum effective stress, where increased stress ceases to have a substantial effect on the filter performance, the signal-insertion loss of the filter is only about 1 dB, as shown by curve 600. At minimum effective stress, where ohmic contacts 101 are in electrical contact with block 100 but with effectively no stress between them, the insertion loss of the filter is about 30 dB, as shown by curve 601. Variation of stress between the minimum and maximum effective stress values can thus vary the insertion loss of the filter by about 29 dB.

Of course, various changes and modifications to the illustrative embodiments described above will be apparent to those skilled in the art. These changes and modifications can be made without departing from the spirit and the scope of the invention and without diminishing its attendant advantages. It is therefore intended that such changes and modifications be covered by the following claims.

The invention claimed is:

1. A filter for an electrical signal having multiple frequencies, comprising:

a conductive ferrite body for filtering out at least one and conducting others of the frequencies of the electrical signal;

a first electrical contact on the body for conveying an unfiltered said electrical signal to the body; and a second electrical contact separated from said first electrical contact on the body for conveying a filtered said electrical signal from the body;

the body being interposed between and separating the electrical conductors from each other and conducting the others of the frequencies from the first to the second electrical contact.

2. The filter of claim 1 wherein:

the filter functions as a cascade of a low-pass filter and a high-pass filter.

3. The filter of claim 1 wherein:

the filter is passive, having no source of electrical power other than the electrical signal that is being filtered.

4. The filter of claim 1 wherein:

the body comprises a manganese zinc material.

5. The filter of claim 1 wherein:

the body comprises a conductive ferrite material having a volume resistivity lower than about 0.1 Ω-cm.

6. A filter for an electrical signal having multiple frequencies, comprising:

a conductive ferrite body for filtering out at least one and conducting others of the frequencies of the electrical signal;

a first electrical contact on the body for conveying an unfiltered said electrical signal to the body;

a second electrical contact on the body for conveying a filtered said electrical signal from the body; and a mechanism coupled to and acting on at least one of the contacts to cause stress between the at least one contact and the body thereby to decrease an attenuation of said others of the frequencies.

7. The filter of claim 6 wherein:

the mechanism is adjustable to vary the stress caused by the mechanism thereby to vary the attenuation of said others of the frequencies.

8. A filter for an electrical signal having multiple frequencies, comprising:

a conductive ferrite body for filtering out at least one and conducting others of the frequencies of the electrical signal;

a first electrical contact on the body for conveying an unfiltered said electrical signal to the body;

a second electrical contact on the body for conveying a filtered said electrical signal from the body; and a mechanism coupled to and acting on the first contact to cause stress between the first contact and the body thereby to decrease an insertion loss of the signal into the filter.

9. The filter of claim 8 wherein:

the mechanism is adjustable to vary the stress caused by the mechanism thereby to vary the insertion loss of the signal into the filter.

10. The filter of claim 1 further comprising:

means for varying a quality of ohmic contact between the contacts and the body to vary the attenuation of said others of the frequencies.

11. A filter for an electrical signal having multiple frequencies, comprising:

a body consisting of an electrically conductive ferrite material that filters out at least one and conducts others of the frequencies of the electrical signal when the body is mounted on a printed circuit board;

a first electrical contact on the body that attaches the filter to a first conductor defined by the printed circuit board and conveys an unfiltered said electrical signal from the first conductor to the body; and a second electrical contact separated from said first electrical contact on the body that attaches the filter to a second conductor defined by the printed circuit board and conveys a filtered said electrical signal from the body to the second conductor.

12. The filter of claim 11 wherein:

the filter functions as a cascade of a low-pass filter and a high-pass filter.

13. The filter of claim 11 wherein:

the filter is passive, having no source of electrical power other than the electrical signal that is being filtered.

14. The filter of claim 11 wherein:

the body comprises a manganese zinc material.

15. The filter of claim 11 wherein:

the body comprises a conductive ferrite material having a volume resistivity on the order of about 0.1 Ω-cm or less.

16. The filter of claim 11 further comprising:

means for varying a quality of ohmic contact between the contacts and the body to vary the attenuation of said others of the frequencies.

17. The filter of claim 11 further comprising:

a mechanism coupled to and acting on at least one of the contacts to cause stress between the at least one contact and the body thereby to decrease an attenuation of said others of the frequencies.

18. The filter of claim 17 wherein:

the mechanism is adjustable to vary the stress caused by the mechanism thereby to vary the attenuation of said others of the frequencies.

19. The filter of claim 11 further comprising:

a mechanism coupled to and acting on the first contact to cause stress between the first contact and the body thereby to decrease an insertion loss of the signal into the filter.

20. The filter of claim 19 wherein:

the mechanism is adjustable to vary the stress caused by the mechanism thereby to vary the insertion loss of the signal into the filter.

* * * * *